(12) United States Patent
Herrington et al.

(10) Patent No.: US 11,701,725 B2
(45) Date of Patent: *Jul. 18, 2023

(54) SYSTEMS AND METHODS FOR SAW TOOTH MILLING TO PREVENT CHIP FRAUD

(71) Applicant: Capital One Services, LLC, McLean, VA (US)

(72) Inventors: Daniel Herrington, New York, NY (US); Stephen Schneider, Midlothian, VA (US); Tyler Maiman, Melville, NY (US)

(73) Assignee: CAPITAL ONE SERVICES, LLC, McLean, VA (US)

( * ) Notice: Subject to any disclaimer, the term of this patent is extended or adjusted under 35 U.S.C. 154(b) by 27 days.

This patent is subject to a terminal disclaimer.

(21) Appl. No.: 17/104,912

(22) Filed: Nov. 25, 2020

(65) Prior Publication Data

US 2021/0187639 A1 Jun. 24, 2021

Related U.S. Application Data

(63) Continuation of application No. 16/723,655, filed on Dec. 20, 2019, now Pat. No. 10,888,940.

(51) Int. Cl.
| | |
|---|---|
| *B23D 61/04* | (2006.01) |
| *G06K 19/077* | (2006.01) |
| *H01L 23/498* | (2006.01) |
| *G06K 7/00* | (2006.01) |

(52) U.S. Cl.
CPC .......... *B23D 61/04* (2013.01); *G06K 7/0091* (2013.01); *G06K 19/07769* (2013.01); *H01L 23/49855* (2013.01)

(58) Field of Classification Search
CPC ................ B23D 61/04; G06K 7/0091; G06K 19/07769; G06K 19/07745; H01L 23/49855
USPC ........................................... 407/61
See application file for complete search history.

(56) References Cited

U.S. PATENT DOCUMENTS

| | | |
|---|---|---|
| 4,079,646 A | 3/1978 | Morishita |
| 4,192,449 A | 3/1980 | Tippetts |
| 4,297,566 A | 10/1981 | Ahmann |
| 4,359,632 A | 11/1982 | Fisher |

(Continued)

FOREIGN PATENT DOCUMENTS

| | | |
|---|---|---|
| EP | 1850255 A1 | 10/2007 |
| EP | 1710692 B1 | 9/2018 |

(Continued)

*Primary Examiner* — Thien M Le
*Assistant Examiner* — Tae W Kim
(74) *Attorney, Agent, or Firm* — Hunton Andrews Kurth LLP

(57) ABSTRACT

Example embodiments of systems and methods for milling patterns for a card are provided. A chip fraud prevention system include a device including a chip. The chip may be at least partially encompassed in a chip pocket. The chip pocket may include one or more shapes. The one or more shapes may include one or more peaks and one or more valleys. One or more connections may be communicatively coupled to at least one surface of the chip. The one or more connections may be placed between at least one of the one or more peaks or one or more valleys.

20 Claims, 18 Drawing Sheets

(56) References Cited

U.S. PATENT DOCUMENTS

| | | |
|---|---|---|
| 4,360,727 A | 11/1982 | Lehmann |
| 4,398,902 A | 8/1983 | Mangum |
| 4,409,471 A | 10/1983 | Aigo |
| 4,431,911 A | 2/1984 | Rayburn |
| 4,441,391 A | 4/1984 | Seaman |
| 4,447,716 A | 5/1984 | Aigo |
| 4,485,298 A | 11/1984 | Stephens et al. |
| 4,503,323 A | 3/1985 | Flam |
| 4,506,148 A | 3/1985 | Berthold et al. |
| 4,511,796 A | 4/1985 | Aigo |
| 4,563,575 A | 1/1986 | Hoppe et al. |
| 4,589,687 A | 5/1986 | Hannon |
| 4,593,384 A | 6/1986 | Kleijne |
| 4,605,845 A | 8/1986 | Takeda |
| 4,625,102 A | 11/1986 | Rebjock et al. |
| 4,637,544 A | 1/1987 | Quercetti |
| 4,727,246 A | 2/1988 | Hara et al. |
| 4,772,783 A | 9/1988 | Ono et al. |
| 4,775,093 A | 10/1988 | Lin |
| 4,795,895 A | 1/1989 | Hara et al. |
| 4,805,797 A | 2/1989 | Natori |
| 4,819,828 A | 4/1989 | Mirabel |
| 4,835,843 A | 6/1989 | Wendt et al. |
| 4,960,983 A | 10/1990 | Inoue |
| 4,987,683 A | 1/1991 | Brych |
| 4,999,601 A | 3/1991 | Gervais |
| 5,105,073 A | 4/1992 | Kovach et al. |
| 5,281,795 A | 1/1994 | Harlan |
| 5,288,979 A | 2/1994 | Kreft |
| 5,303,472 A | 4/1994 | Mbanugo |
| 5,331,139 A | 7/1994 | Lee |
| 5,341,923 A | 8/1994 | Arasim |
| 5,376,778 A | 12/1994 | Kreft |
| 5,416,423 A | 5/1995 | De Borde |
| 5,424,522 A | 6/1995 | Iwata |
| 5,518,171 A | 5/1996 | Moss |
| 5,529,174 A | 6/1996 | McQueeny |
| 5,531,145 A | 7/1996 | Haghiri-Tehrani |
| 5,545,884 A | 8/1996 | Seto et al. |
| 5,557,089 A | 9/1996 | Hall et al. |
| 5,569,898 A | 10/1996 | Fisher et al. |
| 5,600,175 A | 2/1997 | Orthmann |
| 5,703,350 A | 12/1997 | Suhir |
| 5,775,516 A | 7/1998 | McCumber et al. |
| 5,779,055 A | 7/1998 | Lacy, III |
| 5,782,371 A | 7/1998 | Baerenwald et al. |
| 5,796,085 A | 8/1998 | Bleier |
| 5,836,779 A | 11/1998 | Vogler |
| 5,837,153 A | 11/1998 | Kawan |
| 5,837,367 A | 11/1998 | Ortiz, Jr. et al. |
| 5,852,289 A | 12/1998 | Masahiko |
| 5,861,662 A | 1/1999 | Candelore |
| 5,905,252 A | 5/1999 | Magana |
| 5,949,060 A | 9/1999 | Schattschneider et al. |
| 5,984,179 A | 11/1999 | May |
| 6,020,627 A | 2/2000 | Fries et al. |
| 6,041,998 A | 3/2000 | Goldberg |
| 6,068,191 A * | 5/2000 | Dlugosch ......... G06K 19/07743 235/487 |
| 6,073,856 A | 6/2000 | Takahashi |
| 6,094,831 A | 8/2000 | Shigyo |
| 6,095,423 A | 8/2000 | Houdeau et al. |
| 6,105,872 A | 8/2000 | Lotz |
| 6,109,439 A | 8/2000 | Goade, Sr. |
| 6,149,064 A | 11/2000 | Yamaoka et al. |
| 6,186,402 B1 | 2/2001 | Johnson |
| 6,196,594 B1 | 3/2001 | Keller |
| 6,224,108 B1 | 5/2001 | Klure |
| 6,230,977 B1 | 5/2001 | Johnson |
| 6,308,832 B1 | 10/2001 | Pirro et al. |
| 6,364,114 B2 | 4/2002 | Glassman |
| 6,371,364 B1 | 4/2002 | Maillot et al. |
| 6,386,459 B1 | 5/2002 | Patrice et al. |
| 6,424,029 B1 | 7/2002 | Giesler |
| 6,439,613 B2 | 8/2002 | Klure |
| 6,443,041 B1 | 9/2002 | Pirovano et al. |
| 6,488,152 B1 | 12/2002 | Steffann |
| 6,543,809 B1 | 4/2003 | Kistner et al. |
| 6,568,593 B2 | 5/2003 | Hetzer |
| 6,571,953 B2 | 6/2003 | Sherline et al. |
| 6,593,167 B2 | 7/2003 | Dobashi et al. |
| 6,601,329 B2 | 8/2003 | Vaudreuil |
| 6,629,637 B1 | 10/2003 | Von Der Lippe et al. |
| 6,651,891 B1 | 11/2003 | Zakel et al. |
| 6,729,538 B2 | 5/2004 | Farquhar |
| 6,742,117 B1 | 5/2004 | Hikita et al. |
| 6,843,408 B1 | 1/2005 | Agren |
| 6,843,422 B2 | 1/2005 | Jones et al. |
| 7,000,774 B2 | 2/2006 | Bryant |
| 7,003,678 B2 | 2/2006 | Ikefuji et al. |
| 7,080,776 B2 | 7/2006 | Lewis et al. |
| 7,143,935 B2 | 12/2006 | Marta |
| 7,175,085 B2 | 2/2007 | Oguchi |
| 7,207,107 B2 | 4/2007 | Usner et al. |
| 7,284,270 B2 | 10/2007 | Kitamura et al. |
| 7,299,968 B2 | 11/2007 | Mittmann et al. |
| 7,311,263 B2 | 12/2007 | Eichler et al. |
| 7,377,446 B2 | 5/2008 | Ohta et al. |
| 7,588,184 B2 | 9/2009 | Gandel et al. |
| 7,665,668 B2 | 2/2010 | Phillips |
| 7,699,225 B2 | 4/2010 | Horiguchi et al. |
| 7,806,340 B2 | 10/2010 | Daio et al. |
| 7,823,777 B2 | 11/2010 | Varga et al. |
| 7,868,441 B2 | 1/2011 | Eaton et al. |
| 7,931,148 B2 | 4/2011 | Hansen et al. |
| 8,006,834 B2 | 8/2011 | Marcinkowski |
| 8,025,207 B1 | 9/2011 | Correll |
| 8,038,003 B2 | 10/2011 | Rometty et al. |
| 8,076,776 B2 | 12/2011 | Bhate et al. |
| 8,267,327 B2 | 9/2012 | Tsao et al. |
| 8,403,229 B2 | 3/2013 | McGrane |
| 8,496,183 B2 | 7/2013 | Kiyozuka |
| 8,613,389 B2 | 12/2013 | Payne |
| 8,616,373 B2 | 12/2013 | Hansen et al. |
| 8,725,589 B1 | 5/2014 | Skelding et al. |
| 8,783,549 B2 | 7/2014 | Jo |
| 8,800,768 B2 | 8/2014 | Corbat et al. |
| 8,915,434 B2 | 12/2014 | Mitchell et al. |
| 9,082,061 B2 | 7/2015 | Bajolle et al. |
| 9,242,436 B1 | 1/2016 | Hallman et al. |
| 9,569,769 B2 | 2/2017 | Smith et al. |
| 9,576,161 B2 | 2/2017 | Tanaka et al. |
| 9,760,816 B1 | 9/2017 | Williams et al. |
| 9,818,049 B2 | 11/2017 | Goedee et al. |
| 2002/0046635 A1 | 4/2002 | Christen et al. |
| 2002/0070280 A1 | 6/2002 | Ikefuji et al. |
| 2002/0079372 A1 | 6/2002 | Hino |
| 2003/0052033 A1 | 3/2003 | Schwester |
| 2003/0069860 A1 | 4/2003 | Berndtsson et al. |
| 2003/0164320 A1 | 9/2003 | Magnusson |
| 2003/0205624 A1 | 11/2003 | Huang et al. |
| 2004/0026520 A1 | 2/2004 | Kawai et al. |
| 2004/0079805 A1 | 4/2004 | Nagata et al. |
| 2004/0079806 A1 | 4/2004 | Ogushi |
| 2004/0123715 A1 | 7/2004 | Stuckel et al. |
| 2004/0129788 A1 | 7/2004 | Takahashi et al. |
| 2004/0159570 A1 | 8/2004 | Schwester |
| 2004/0173686 A1 | 9/2004 | Al Amri |
| 2005/0103832 A1 | 5/2005 | Correll |
| 2005/0194454 A1 | 9/2005 | Ferber et al. |
| 2005/0211600 A1 | 9/2005 | Saito |
| 2005/0211785 A1 | 9/2005 | Ferber et al. |
| 2005/0218027 A1 | 10/2005 | Lammers et al. |
| 2006/0016704 A1 | 1/2006 | Moskovich et al. |
| 2006/0027481 A1 | 2/2006 | Gelardi et al. |
| 2006/0044138 A1 | 3/2006 | Sin |
| 2006/0086793 A1 | 4/2006 | Oguchi |
| 2006/0091212 A1 | 5/2006 | Chien et al. |
| 2006/0118642 A1 | 6/2006 | Latka et al. |
| 2006/0266672 A1 | 11/2006 | Young |
| 2006/0273149 A1 | 12/2006 | Awano |
| 2006/0278640 A1 | 12/2006 | Watts |
| 2006/0289665 A1 | 12/2006 | Yoda |
| 2007/0051653 A1 | 3/2007 | Tilton |

(56) References Cited

U.S. PATENT DOCUMENTS

| | | |
|---|---|---|
| 2007/0187264 A1 | 8/2007 | Hofte et al. |
| 2007/0187273 A1 | 8/2007 | Grosskopf |
| 2007/0187835 A1 | 8/2007 | Chi |
| 2007/0193922 A1 | 8/2007 | Bacon et al. |
| 2008/0067247 A1 | 3/2008 | McGregor et al. |
| 2008/0142393 A1 | 6/2008 | Grosskopf |
| 2008/0164320 A1 | 7/2008 | Garrido-Gadea et al. |
| 2008/0251905 A1 | 10/2008 | Pope et al. |
| 2008/0314784 A1 | 12/2008 | Schroeder |
| 2009/0047104 A1 | 2/2009 | Jung |
| 2010/0025400 A1 | 2/2010 | Sytsma |
| 2010/0122984 A1 | 5/2010 | Kim et al. |
| 2010/0133123 A1 | 6/2010 | Thibault |
| 2010/0182020 A1 | 7/2010 | Thornley et al. |
| 2010/0206942 A1 | 8/2010 | Rometty et al. |
| 2010/0288833 A1 | 11/2010 | Santos et al. |
| 2011/0068159 A1 | 3/2011 | Yamada et al. |
| 2011/0101080 A1 | 5/2011 | Ho |
| 2011/0233098 A1 | 9/2011 | Ye et al. |
| 2011/0233099 A1 | 9/2011 | Pitt |
| 2011/0255253 A1 | 10/2011 | Campbell et al. |
| 2011/0259899 A1 | 10/2011 | McClure |
| 2011/0290675 A1 | 12/2011 | Shiue et al. |
| 2012/0048924 A1 | 3/2012 | Hong |
| 2012/0106113 A1 | 5/2012 | Kirmayer |
| 2012/0126004 A1 | 5/2012 | Chen |
| 2012/0181158 A1 | 7/2012 | Chang |
| 2013/0068651 A1 | 3/2013 | Gelardi et al. |
| 2013/0068844 A1 | 3/2013 | Bosquet et al. |
| 2013/0119147 A1 | 5/2013 | Varga et al. |
| 2013/0233754 A1 | 9/2013 | Liu |
| 2013/0306512 A1 | 11/2013 | Smith |
| 2013/0341408 A1 | 12/2013 | Pyhrr et al. |
| 2014/0274641 A1 | 9/2014 | Tattersall |
| 2014/0346220 A1 | 11/2014 | Saulas |
| 2015/0069131 A1 | 3/2015 | Scanlon et al. |
| 2015/0108606 A1 | 4/2015 | Lamy et al. |
| 2015/0136777 A1 | 5/2015 | Baillies |
| 2015/0166218 A1 | 6/2015 | Banducci |
| 2015/0225157 A1 | 8/2015 | Nakamura et al. |
| 2016/0009473 A1 | 1/2016 | Korinek et al. |
| 2016/0031624 A1 | 2/2016 | Pascua et al. |
| 2016/0137373 A1 | 5/2016 | Olschan et al. |
| 2016/0162712 A1 | 6/2016 | Ozawa et al. |
| 2016/0193748 A1 | 7/2016 | Luhmann |
| 2016/0229081 A1 | 8/2016 | Williams et al. |
| 2016/0272396 A1 | 9/2016 | Cataudella et al. |
| 2016/0272398 A1 | 9/2016 | Cataudella et al. |
| 2017/0109622 A1 | 4/2017 | Cepress et al. |
| 2017/0344869 A1 | 11/2017 | Williams et al. |
| 2017/0351880 A1 | 12/2017 | Ozawa et al. |
| 2018/0022498 A1 | 1/2018 | Everett |
| 2018/0044051 A1 | 2/2018 | Chang |
| 2018/0079248 A1 | 3/2018 | Pascua et al. |

FOREIGN PATENT DOCUMENTS

| | | |
|---|---|---|
| WO | 2007003301 A1 | 1/2007 |
| WO | 2007052116 A1 | 5/2007 |
| WO | 2013051029 A | 4/2013 |
| WO | 2013112839 A | 8/2013 |
| WO | 2016172449 A1 | 10/2016 |

\* cited by examiner

SYSTEMS AND METHODS FOR SAW TOOTH MILLING TO PREVENT CHIP FRAUD

CROSS REFERENCE TO RELATED APPLICATION

This application is a continuation of U.S. patent application Ser. No. 16/723,655 filed Dec. 20, 2019, the disclosure of which is incorporated herein by reference in its entirety.

FIELD OF THE INVENTION

The present disclosure relates to systems and methods for milling patterns for a card, such as a smartcard, and more particularly, to systems and methods for saw tooth milling to prevent chip fraud.

BACKGROUND

Removing a chip from one smartcard and inserting it into another smartcard or other device increases the risk of fraud. Moreover, conventional chip placement methods, such as methods that use smooth milling patterns, are ineffective due to the ease of chip removal. For example, for smartcards having chips, there is a significant likelihood of the removal of chips that are not securely positioned, such as by physical removal or thermal removal, and these chips may then be subject to re-implantation into another card or other device. As a consequence, smartcards having chips may be fraudulently manipulated, reprogrammed, and/or otherwise misused.

These and other deficiencies exist. Accordingly, there is a need for a chip fraud prevention system that improves security, reduces the risk of fraud, reduces cost, and increases durability.

SUMMARY

Aspects of the disclosed technology include systems and methods for milling patterns for a card, such as a smartcard. Various embodiments describe systems and methods for saw tooth milling to prevent chip fraud.

Embodiments of the present disclosure provide a chip fraud prevention system that may comprise a device including a chip. The chip may be at least partially encompassed in a chip pocket. The chip pocket may include one or more shapes. The one or more shapes may include one or more peaks and one or more valleys. The one or more connections may be communicatively coupled to one or more surfaces of the chip. The one or more connections may be placed between at least one of the one or more peaks or one or more valleys, or any combination thereof.

Embodiments of the present disclosure provide a method of preventing chip removal comprising the steps of: positioning a chip of a device in a reservoir, wherein the reservoir comprises one or more shapes, the one or more shapes comprising one or more peaks and one or more valleys formed in a saw tooth milling pattern; and communicatively coupling one or more components to a first surface of the chip, the one or more components placed between at least one of the one or more peaks or one or more valleys, or any combination thereof.

Embodiments of the present disclosure provide a contactless card including a substrate layer. The contactless card may include one or more integrated circuits positioned in one or more housings, wherein each of the one or more housings includes one or more shapes. The one or more shapes may include one or more peaks and one or more valleys, and one or more air gaps, formed in a saw tooth milling pattern. One or more connections may be communicatively coupled to one or more surfaces of each of the one or more integrated circuits. The one or more connections may include at least one or more wires, pins, or any combination thereof. The one or more connections may be placed between at least one of the one or more peaks or one or more valleys, or any combination thereof.

Further features of the disclosed design, and the advantages offered thereby, are explained in greater detail hereinafter with reference to specific example embodiments illustrated in the accompanying drawings.

DETAILED DESCRIPTION OF EXAMPLE EMBODIMENTS

Systems and methods described herein are directed to improving durability for chip placement methods in a contactless card, including saw tooth milling pattern and other means of preventing removal of the chip described herein. As further described below, the saw tooth milling pattern promotes the success of adhesion of the chip to a chip pocket of the contactless card while also creating an uneven cutting process to prevent removal of the chip. As a consequence of this and the other removal prevention designs described herein, chip fraud is reduced or eliminated. Further cost and resource savings may be achieved through a decrease in fraud, including decreased needs for investigating and refunding fraudulent transactions, customer support, and replacing smartcards.

Figure 1A:
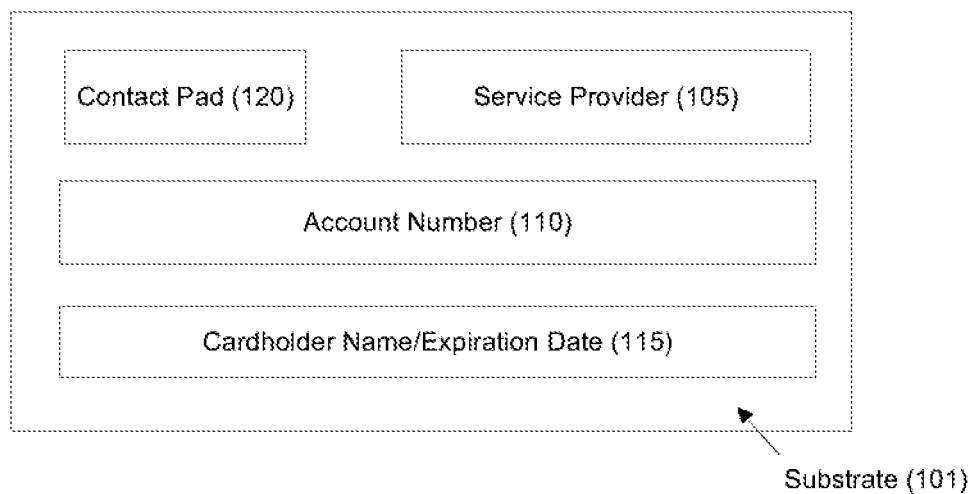
FIG. 1A is an illustration of a card according to an example embodiment.

FIG. 1A illustrates one or more contactless cards 100, which may comprise a payment card, such as a credit card, debit card, or gift card, issued by a service provider 105 displayed on the front or back of the card 100. In some examples, the contactless card 100 is not related to a payment card, and may comprise, without limitation, an identification card, a membership card, a data storage card, or other type of card. In some examples, the payment card may comprise a contactless card, such as a dual interface contactless payment card, a contact card that requires physical contact with a card reader, or other type of chip-based card. The card 100 may comprise a substrate 101, which may include a single layer or one or more laminated layers composed of plastics, metals, and other materials. Exemplary substrate materials include polyvinyl chloride, polyvinyl chloride acetate, acrylonitrile butadiene styrene, polycarbonate, polyesters, anodized titanium, palladium, gold, carbon, paper, and biodegradable materials. In some examples, the card 100 may have physical characteristics compliant with the ID-1 format of the ISO/IEC 7810 standard, and the card may otherwise be compliant with the ISO/IEC 14443 standard. However, it is understood that the card 100 according to the present disclosure may have different characteristics, and the present disclosure does not require a card to be implemented in a payment card.

The card 100 may comprise account number information 110 that may be displayed on the front and/or back of the card 100. The card 100 may also include identification information 115 displayed on the front and/or back of the card 100, and a contact pad 120. In some examples, identification information 115 may comprise one or more of cardholder name and expiration date of the card 100. The contact pad 120 may be configured to establish contact with another communication device, such as a user device, smart phone, laptop, desktop, or tablet computer. The card 100 may also include processing circuitry, antenna and other components not shown in FIG. 1A. These components may be located behind the contact pad 120 or elsewhere on the substrate 101. The card 100 may also include a magnetic strip or tape, which may be located on the back of the card (not shown in FIG. 1A).

Figure 1B:
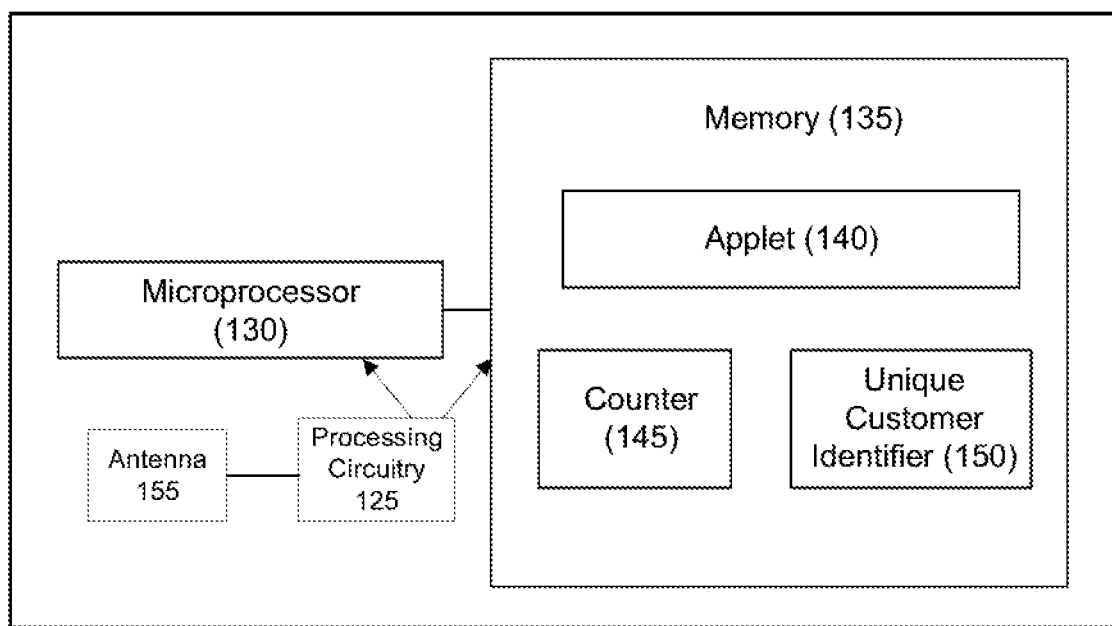
FIG. 1B is an illustration of a contact pad of a card according to an example embodiment.

As illustrated in FIG. 1B, the contact pad 120 of FIG. 1A may include processing circuitry 125 for storing and processing information, including a microprocessor 130 and a memory 135. It is understood that the processing circuitry 125 may contain additional components, including processors, memories, error and parity/CRC checkers, data encoders, anticollision algorithms, controllers, command decoders, security primitives and tamperproofing hardware, as necessary to perform the functions described herein.

The memory 135 may be a read-only memory, write-once read-multiple memory or read/write memory, e.g., RAM, ROM, and EEPROM, and the card 100 may include one or more of these memories. A read-only memory may be factory programmable as read-only or one-time programmable. One-time programmability provides the opportunity to write once then read many times. A write once/read-multiple memory may be programmed at a point in time after the memory chip has left the factory. Once the memory is programmed, it may not be rewritten, but it may be read many times. A read/write memory may be programmed and re-programed many times after leaving the factory. It may also be read many times.

The memory 135 may be configured to store one or more applets 140, one or more counters 145, and a customer identifier 150. The one or more applets 140 may comprise one or more software applications configured to execute on one or more cards, such as Java Card applet. However, it is understood that applets 140 are not limited to Java Card applets, and instead may be any software application operable on cards or other devices having limited memory. The one or more counters 145 may comprise a numeric counter sufficient to store an integer. The customer identifier 150 may comprise a unique alphanumeric identifier assigned to a user of the card 100, and the identifier may distinguish the user of the card from other card users. In some examples, the customer identifier 150 may identify both a customer and an account assigned to that customer and may further identify the card associated with the customer's account.

The processor and memory elements of the foregoing exemplary embodiments are described with reference to the contact pad, but the present disclosure is not limited thereto. It is understood that these elements may be implemented outside of the pad 120 or entirely separate from it, or as further elements in addition to processor 130 and memory 135 elements located within the contact pad 120.

In some examples, the card 100 may comprise one or more antennas 155. The one or more antennas 155 may be placed within the card 100 and around the processing circuitry 125 of the contact pad 120. For example, the one or more antennas 155 may be integral with the processing circuitry 125 and the one or more antennas 155 may be used with an external booster coil. As another example, the one or more antennas 155 may be external to the contact pad 120 and the processing circuitry 125.

In an embodiment, the coil of card 100 may act as the secondary of an air core transformer. The terminal may communicate with the card 100 by cutting power or amplitude modulation. The card 100 may infer the data transmitted from the terminal using the gaps in the card's power connection, which may be functionally maintained through one or more capacitors. The card 100 may communicate back by switching a load on the card's coil or load modulation. Load modulation may be detected in the terminal's coil through interference.

Figure 2A:
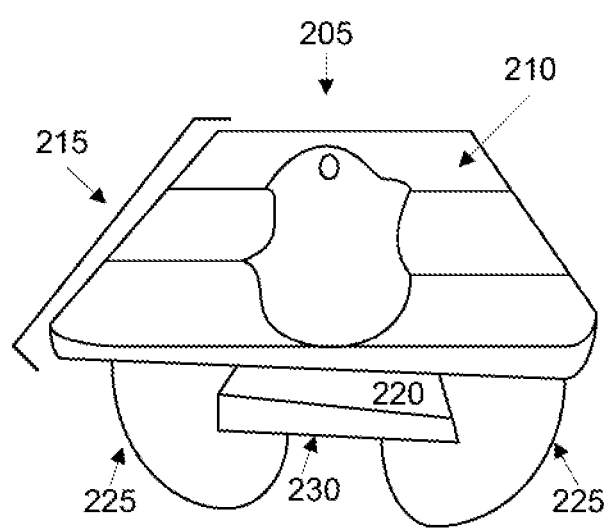
FIG. 2A is an illustration of a contact pad and a chip according to an example embodiment.

As illustrated in FIG. 2A, system 200 depicts various schematics of a surface of a contact pad and a chip. FIG. 2A may reference the same or similar components as illustrated in FIG. 1A and FIG. 1B, including the card, chip and the contact pad. In some examples, the chip may comprise an integrated circuit. In one example, contact pad 205 may include a planar surface 210 comprising a pad substrate 215 and a chip 220 embedded, integrated, or otherwise in communication with contact pad 205 via one or more electronic components or connections 225. For example, one or more connections 225 may comprise one or more leads, wires or pins, or any combination thereof, communicatively coupled to chip 220. One or more connections 225 may be configured to connect to a chip surface 230 of the chip 220. As illustrated in FIG. 2A, the chip surface 230 may comprise an exterior region of chip 220, and the chip 220 is shown as projecting outwards from card 205 to depict its connectivity.

Figure 2B:
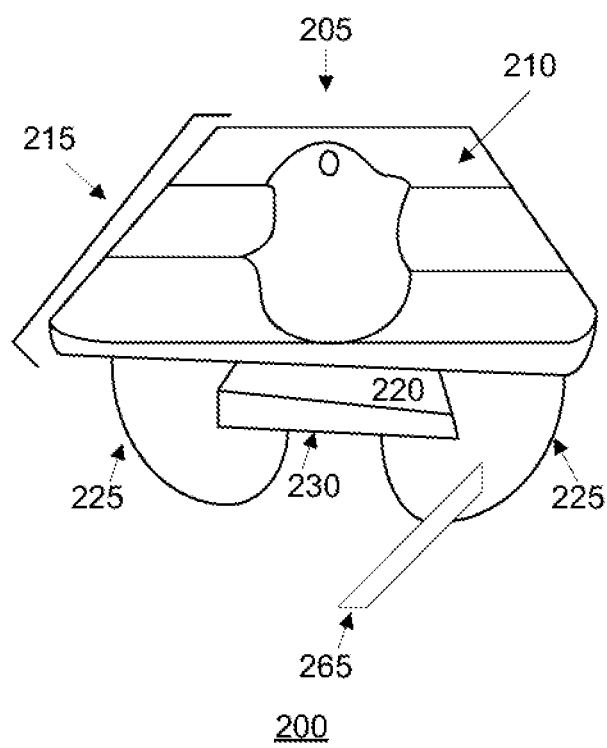
FIG. 2B is an illustration of a contact pad and a chip according to an example embodiment.

As illustrated in FIG. 2B, the one or more connections 225, as previously depicted in FIG. 2A, are shown as being removed. FIG. 2B may reference the same or similar components of contact pad 205 as previously described with reference to FIG. 2A. In some examples, removal of the one or more connections 225 may take place by one or more structures 265, including but not limited to one or more of wire cutters, scissors, clippers, picks, pliers, pins, threads, needles, blades, knives, or any other structure, or any combination thereof, configured to remove the one or more connections 225.

Figure 2C:
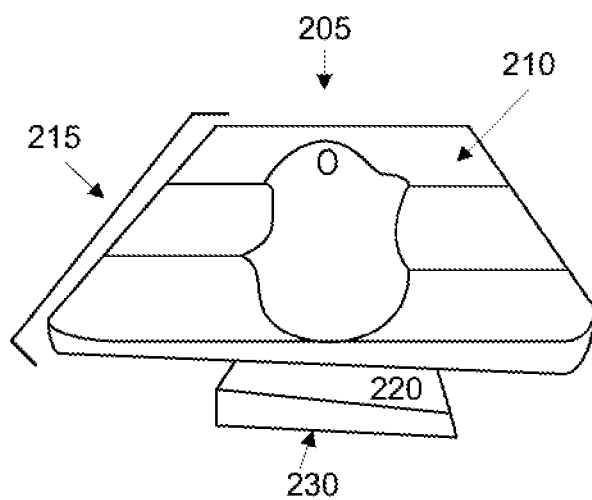
FIG. 2C is an illustration of a contact pad and a chip according to an example embodiment.

As illustrated in FIG. 2C, the one or more connections 225, as previously depicted in FIG. 2B, have been severed due to the removal by one or more structures 265 as explained above with reference to FIG. 2B. FIG. 2C may reference the same or similar components of card 205 as previously described with reference to FIG. 2B.

Figure 2D:
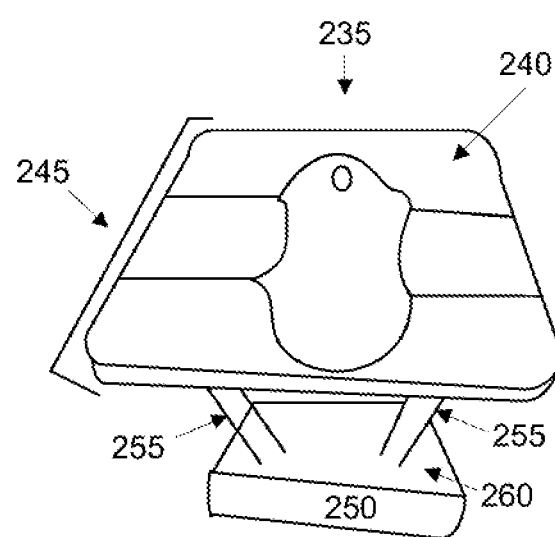
FIG. 2D is an illustration of a contact pad and a chip according to an example embodiment.

FIG. 2D illustrates another example of a contact pad and a chip. As shown in FIG. 2D, contact pad 235 includes a planar surface 240 comprising a pad substrate 245 and a chip 250 embedded, integrated, or otherwise in communication with card 205 via one or more electronic components or connections 255. For example, one or more connections 255 may comprise one or more wires or pins, or any combination thereof, communicatively coupled to chip 250. One or more connections 255 may be configured to connect a surface 260 of the chip 250. As illustrated in FIG. 2D, surface 260 may comprise an interior region of chip 250, and the chip 250 is shown as projecting outwards from card 205 to depict its connectivity. As further illustrated in FIG. 2D, one or more connections 255 of card 235 have not yet been severed.

Figure 2E:
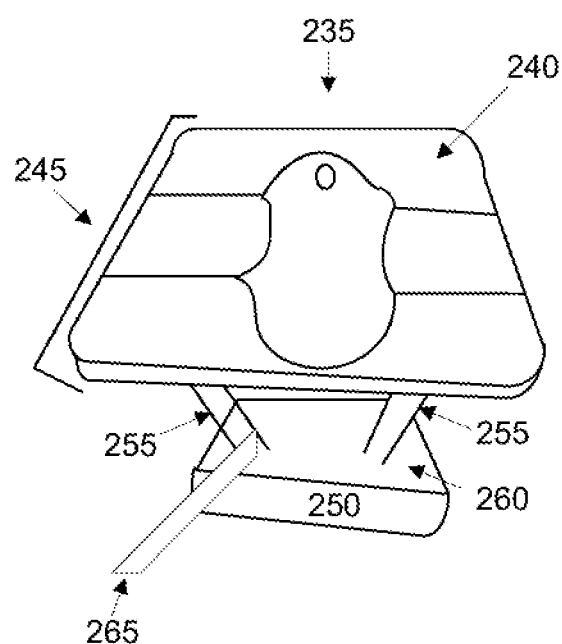
FIG. 2E is an illustration of a contact pad and a chip according to an example embodiment.

As illustrated in FIG. 2E, the one or more connections 255 of card 235, as previously depicted in FIG. 2D, are shown as being removed. FIG. 2E may reference the same or similar components of card 235 as previously described with reference to FIG. 2D. In some examples, removal of the one or more leads 255 may take place by one or more structures 265, including but not limited to one or more of wire cutters, scissors, clippers, picks, pliers, pins, threads, needles, blades, knives, or any other structure, or any combination thereof, configured to remove one or more connections 255.

Figure 2F:
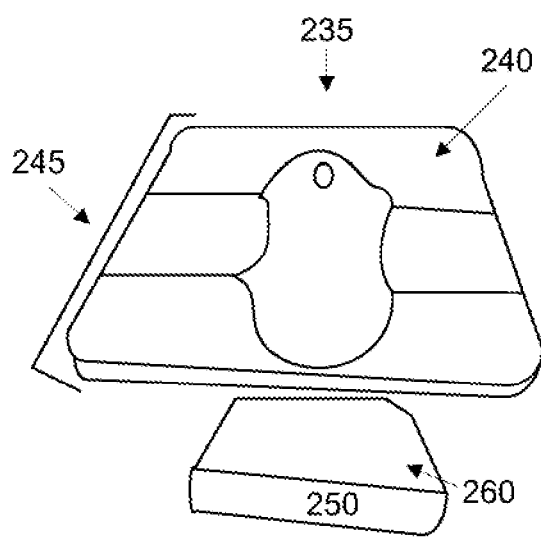
FIG. 2F is an illustration of a contact pad and a chip according to an example embodiment.

As illustrated in FIG. 2F, the one or more connections 255 of card 235, as previously depicted in FIG. 2E, have been severed due to the removal by one or more structures 265 as explained above with reference to FIG. 2E. FIG. 2F may reference the same or similar components of card 235 as previously described with reference to FIG. 2E.

Figure 3A:
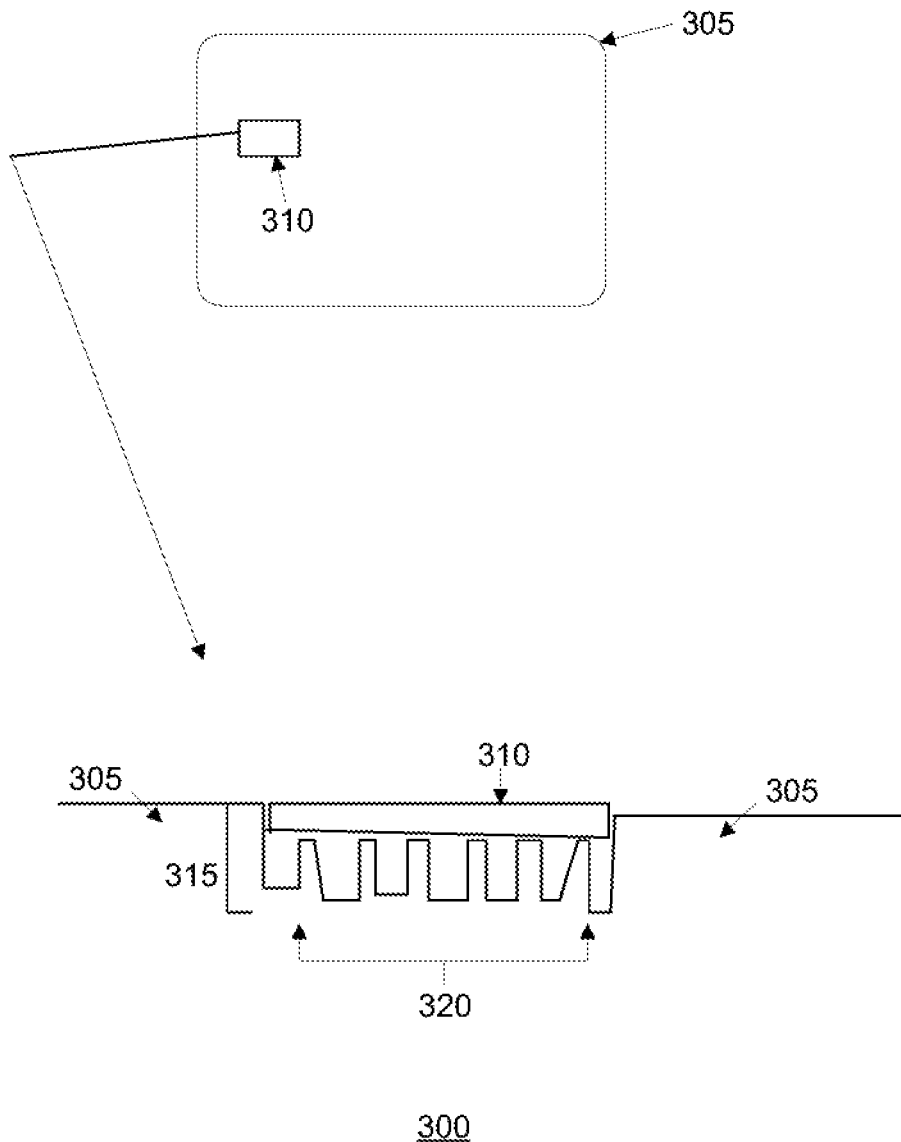
FIG. 3A is an illustration of a cross-sectional view of a chip pocket and a chip according to an example embodiment.

As illustrated in FIG. 3A, system 300 depicts a schematic of cross-sectional view of a chip pocket of a card. FIG. 3A may reference the same or similar components as illustrated in FIGS. 2A-2F, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3A, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although seven types of peaks and valleys are illustrated in FIG. 3A, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3A depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3B:
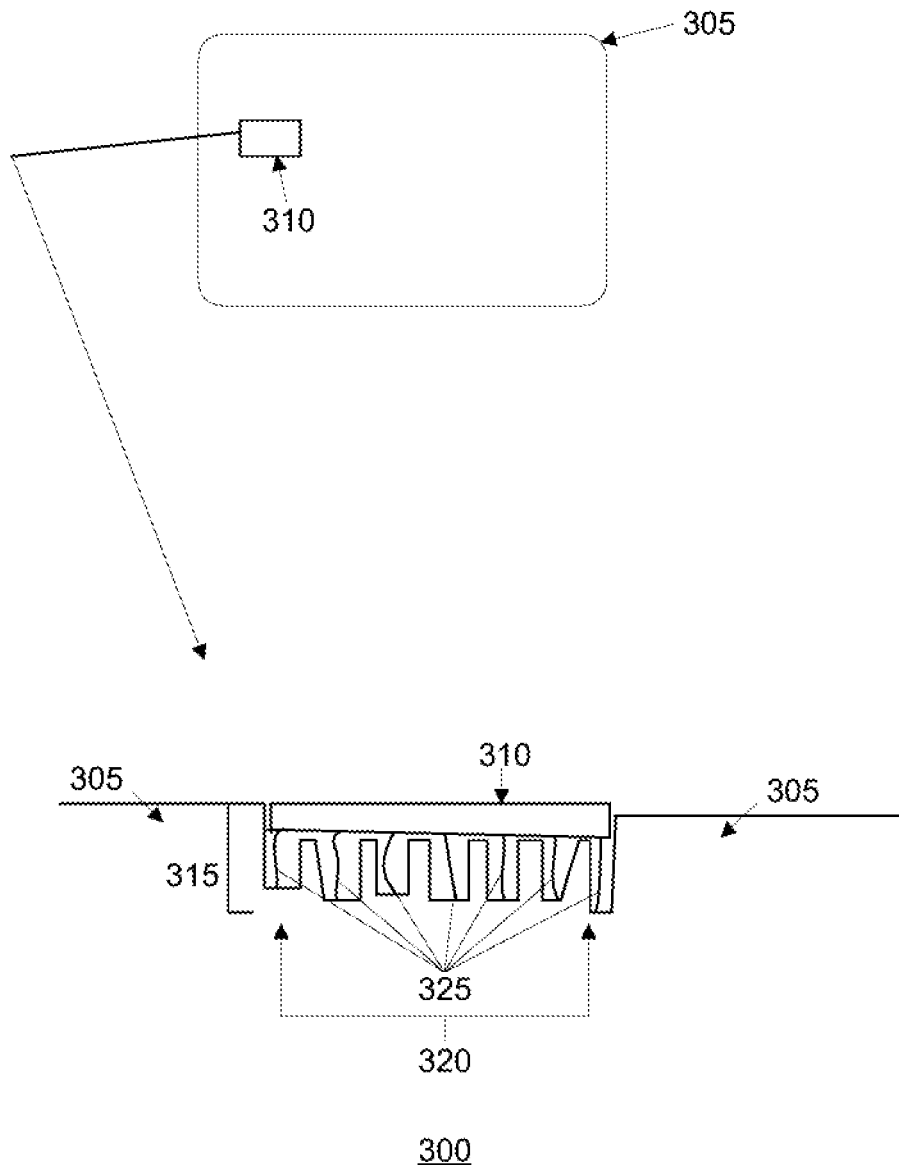
FIG. 3B is an illustration of a cross-sectional view of a chip pocket and a chip according to an example embodiment.

FIG. 3B illustrates another example embodiment of the system 300 shown in FIG. 3A, including a card 305, a chip 310, a chip pocket 315, and one or more peaks and one or more valleys 320 that may comprise one or more air gaps. As shown in FIG. 3B, one or more connections 325, which may comprise one or more leads, wires or pins, or any combination thereof, may be communicatively coupled to at least a portion of the chip 310. The one or more connection 325 may be disposed between the one or peaks and one or more valleys 320. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3C:
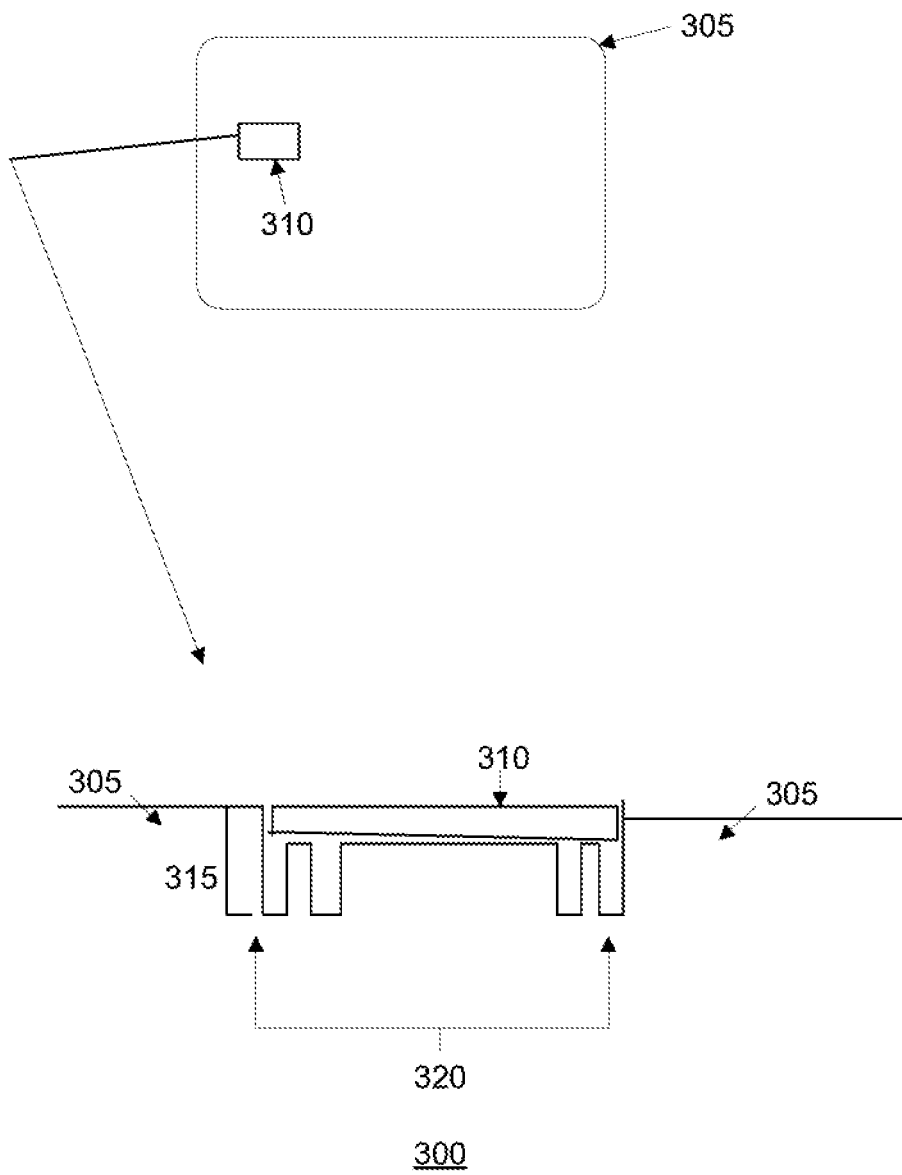
FIG. 3C is an illustration of a cross-sectional view of a chip pocket and a chip according to an example embodiment.

As illustrated in FIG. 3C, system 300 depicts a schematic of cross-sectional view of a chip pocket of a card. FIG. 3C may reference the same or similar components as illustrated in FIGS. 3A-3B, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3C, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although three peaks and four valleys are illustrated in FIG. 3C, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3C depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3D:
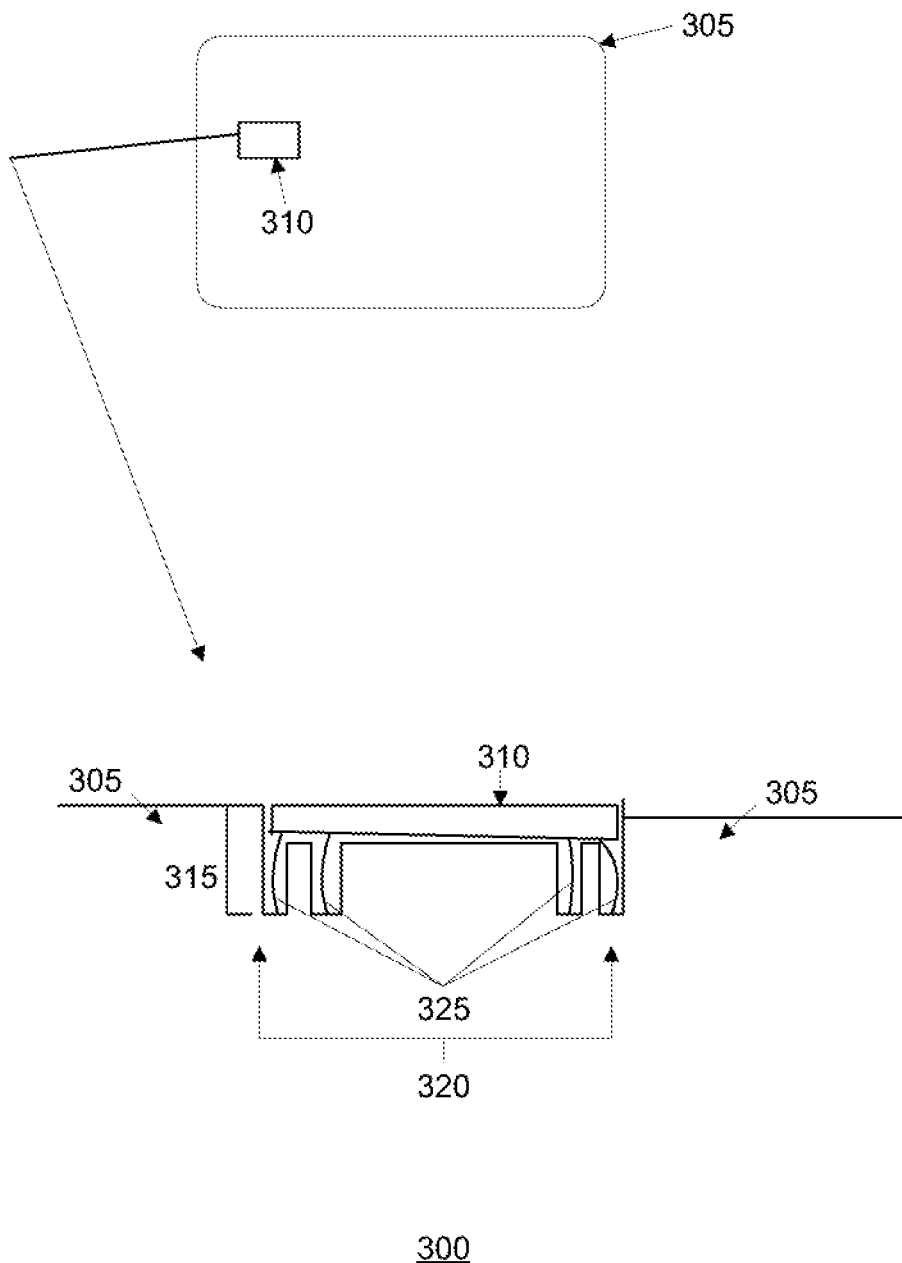
FIG. 3D is an illustration of a cross-sectional view of a chip pocket and a chip according to an example embodiment.

FIG. 3D illustrates another example embodiment of the system 300 shown in FIG. 3C, including a card 305, a chip 310, a chip pocket 315, and one or more peaks and one or more valleys 320 that may comprise one or more air gaps. As shown in FIG. 3D, one or more connections 325, which may comprise one or more leads, wires or pins, or any combination thereof, may be communicatively coupled to at least a portion of the chip 310. The one or more connection 325 may be disposed between the one or peaks and one or more valleys 320. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3E:
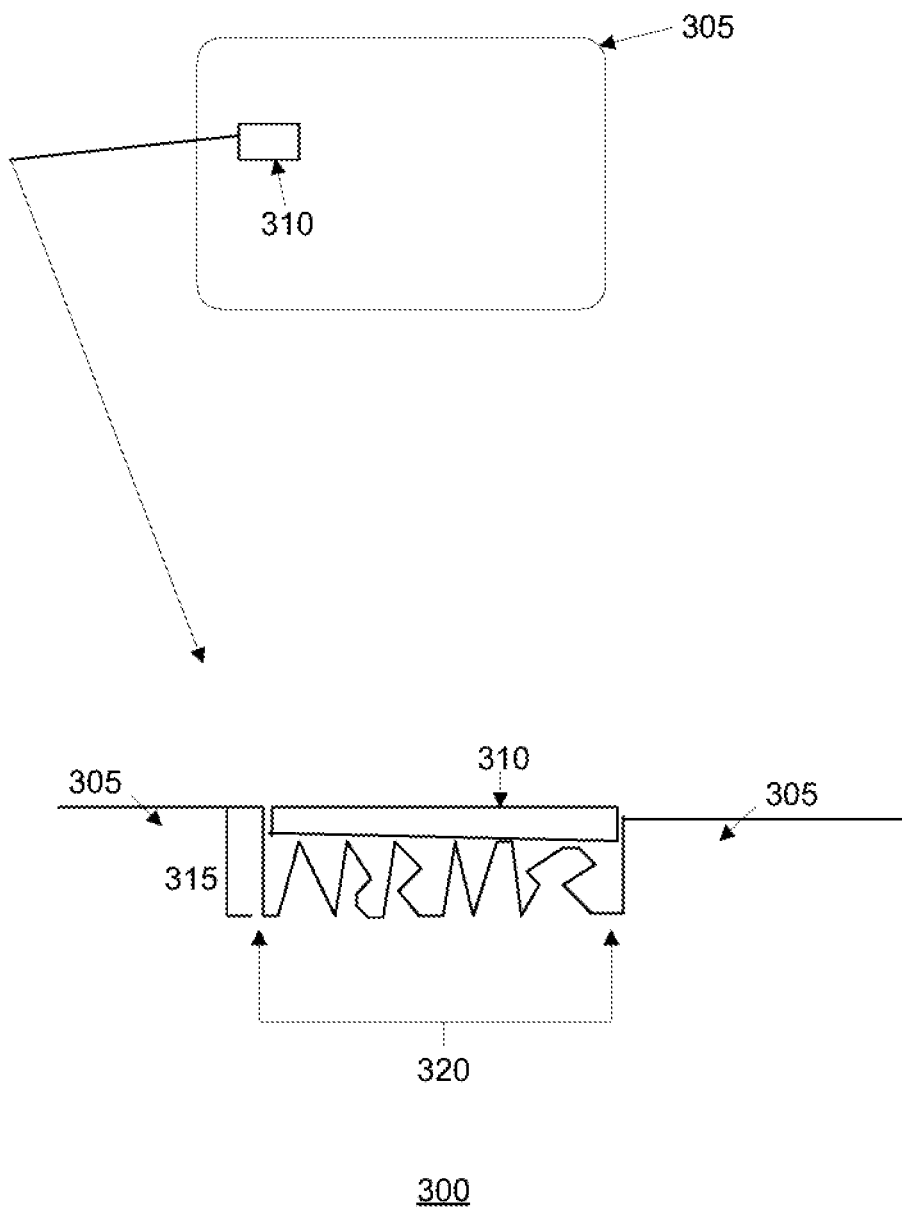
FIG. 3E is an illustration of a cross-sectional view of a chip pocket and a chip according to an example embodiment.

As illustrated in FIG. 3E, system 300 depicts a schematic of cross-sectional view of a chip pocket of a card. FIG. 3E may reference the same or similar components as illustrated in FIGS. 3A-3D, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3E, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although three peaks and four valleys are illustrated in FIG. 3E, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3E depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3F:
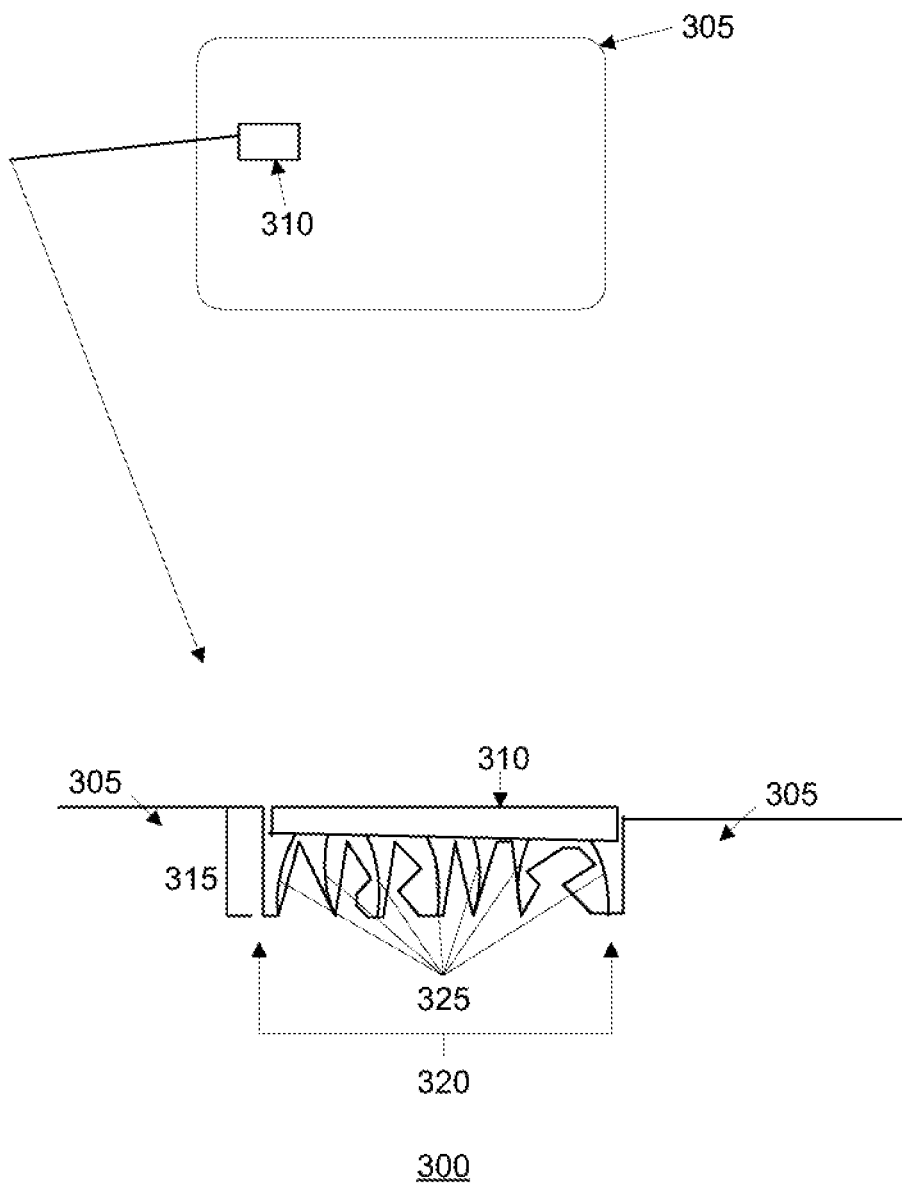
FIG. 3F is an illustration of a cross-sectional view of a chip pocket and a chip according to an example embodiment.

FIG. 3F illustrates another example embodiment of the system 300 shown in FIG. 3E, including a card 305, a chip 310, a chip pocket 315, and one or more peaks and one or more valleys 320 that may comprise one or more air gaps. As shown in FIG. 3F, one or more connections 325, which may comprise one or more leads, wires or pins, or any combination thereof, may be communicatively coupled to at least a portion of the chip 310. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3G:
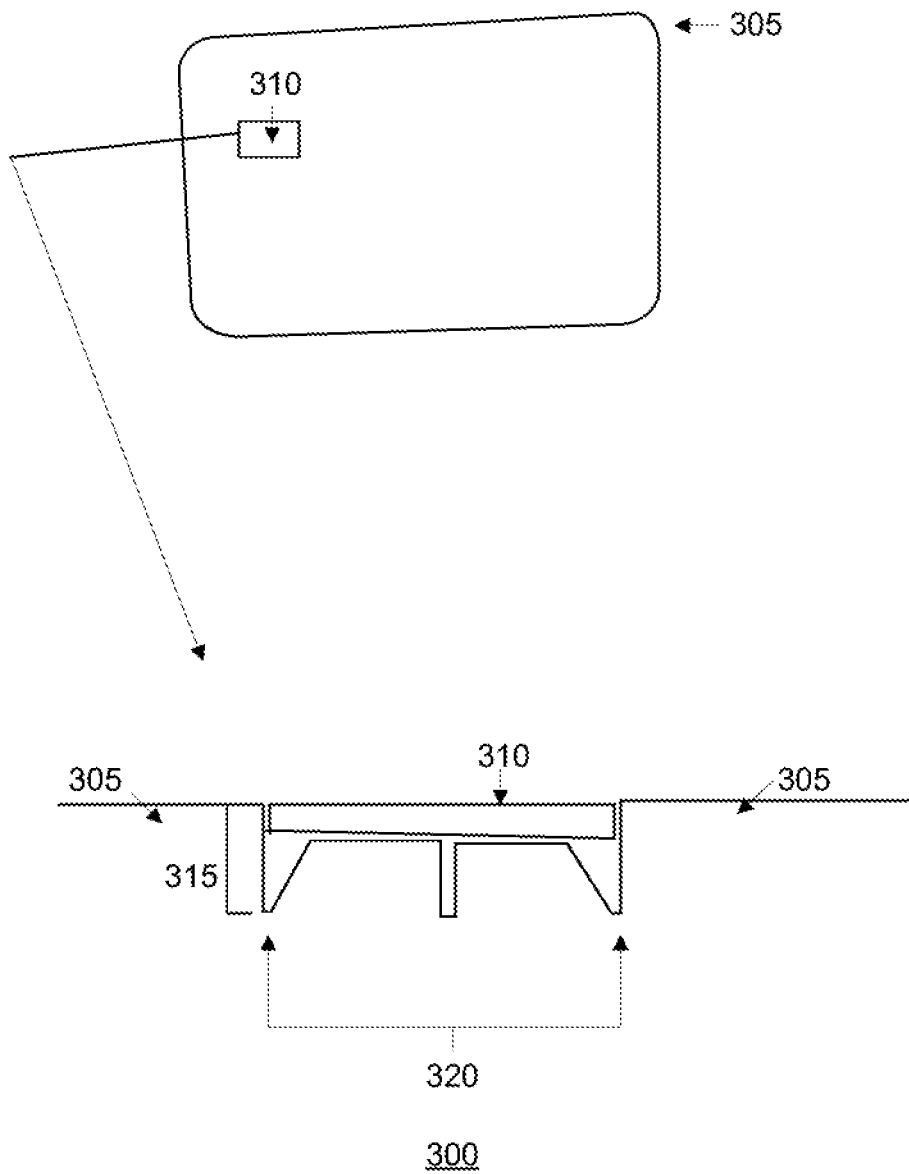
FIG. 3G is an illustration of a cross-sectional view of a chip pocket and a chip according to an example embodiment.

As illustrated in FIG. 3G, system 300 depicts a schematic of cross-sectional view of a chip pocket of a card. FIG. 3G may reference the same or similar components as illustrated in FIGS. 3A-3F, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3G, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although two peaks and three valleys are illustrated in FIG. 3G, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3G depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3H:
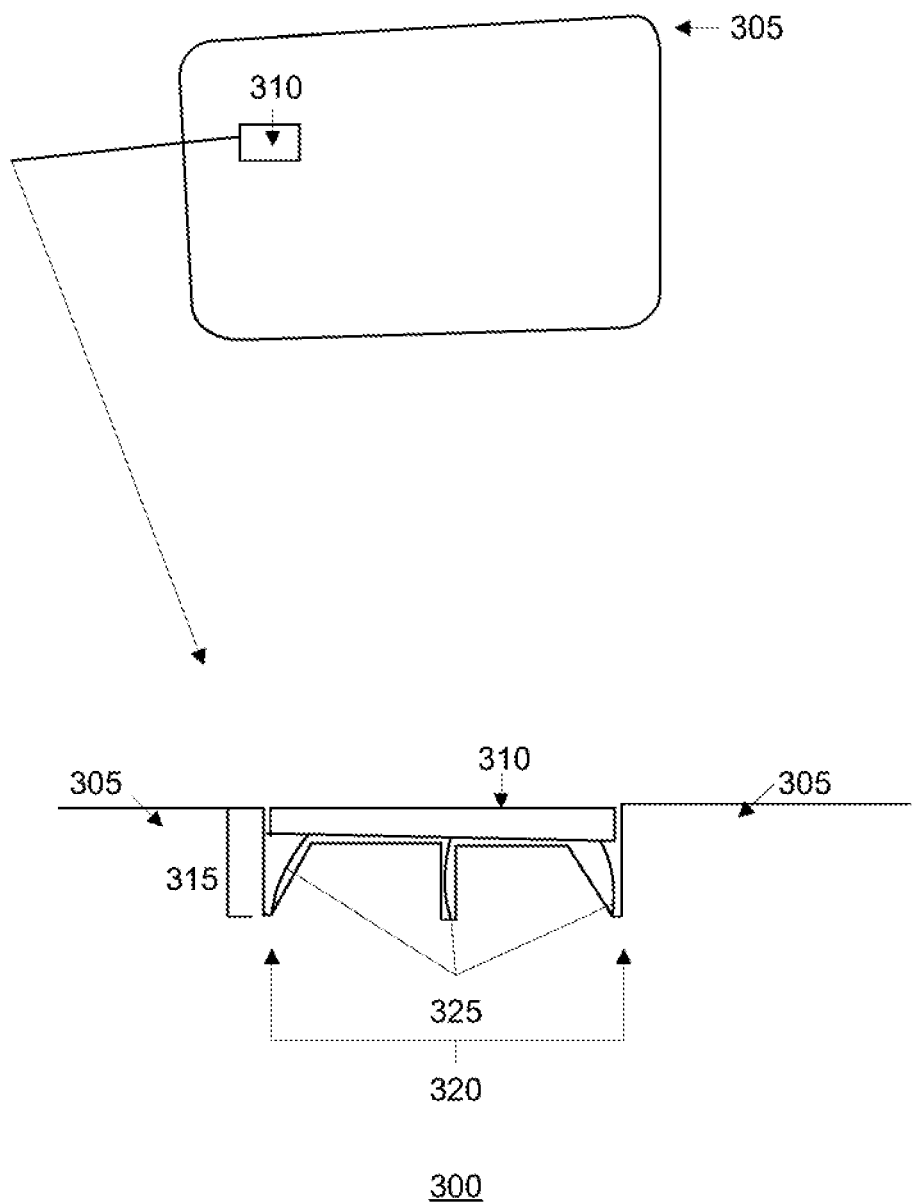
FIG. 3H is an illustration of a cross-sectional view of a chip pocket and a chip according to an example embodiment.

FIG. 3H illustrates another example embodiment of the system 300 shown in FIG. 3H, including a card 305, a chip 310, a chip pocket 315, and one or more peaks and one or more valleys 320 that may comprise one or more air gaps. As shown in FIG. 3H, one or more connections 325, which may comprise one or more leads, wires or pins, or any combination thereof, may be communicatively coupled to at least a portion of the chip 310. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more connections 325 between the one or peaks and one or more valleys 320 may increase the difficulty of removing the chip and reduce the likelihood that chip fraud may be committed.

Figure 4:
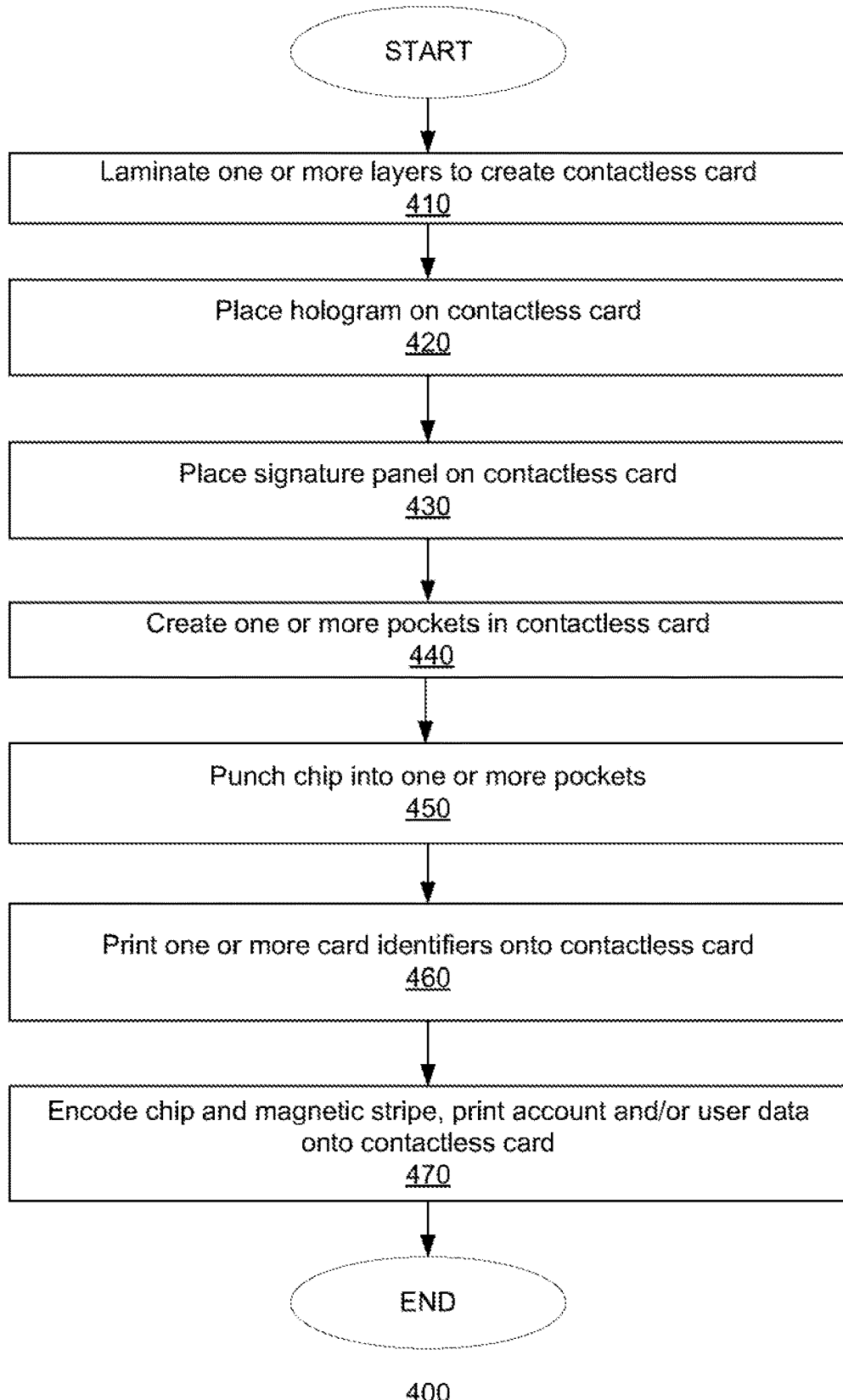
FIG. 4 illustrates a method of making a card according to an example embodiment.

FIG. 4 illustrates a method 400 of making a card. FIG. 4 may reference the same or similar components of FIGS. 1-3, as explained above.

At block 410, method may comprise laminating one or more layers together. In some examples, the one or more layers may comprise an outermost or exterior layer which includes a layer that receives paint, ink, or laser treatment. The outermost or exterior layer may comprise the ceiling or top layer of the one or more laminated layers. The outermost or exterior layer may comprise a thin film that receives laser personalization. In some examples, the laser personalization may comprise custom laser personalization.

The one or more layers may further comprise one or more artwork layers positioned below the outermost or exterior layer. For example, the one or more artwork layers may comprise personalized information about the user and/or financial institution that issues the card.

The one or more layers may further comprise one or more metal core layers positioned below the one or more artwork layers.

The one or more layers may comprise one or more magnetic stripe layer positioned below the one or more metal core layers. In some examples, the one or more magnetic stripe layers may comprise the innermost or interior layer of the card.

In some examples, the one or more layers may be arranged in one or more sheets. By way of an example, each sheet may comprise a plurality of cards. In some examples, one or more sheets may comprise 50 or more cards. The one or more sheets may be fed to a laminating press which is configured to laminate the one or more layers together. In some examples, the lamination process may comprise hot lamination or cold lamination. At this point, the card includes the one or more layers, and does not yet include personal information, a signature panel, a hologram, and a chip.

At block 420, a hologram may be placed on the card. In some examples, the hologram may comprise a secure hologram, and the hologram may be placed on an area of the card. In some examples, the hologram may be placed on a secure area of the card that may be checked by a merchant.

At block 430, a signature panel may be placed on the card. In some examples, the signature panel may be heat stamped onto a portion the card. The signature panel may also be checked by a merchant. The signature panel may be placed on a portion of the card, such as the back of the card.

At block 440, the card may be transferred to one or more machines. The one or more machines may comprise a stamping machine and may be configured to mill one or more chip pockets and embed a chip into the card. In some examples, the card may comprise a chip that is at least partially or wholly positioned on or at least partially or wholly encompassed or at least partially or wholly integrated within a housing or reservoir, the housing or reservoir comprising a chip pocket. As further discussed below, one or more connections may communicatively couple at least a portion, such as a surface, of the chip which may be at least partially or wholly disposed on one or more peaks and one or more valleys of the chip pocket. In some examples, the one or more peaks and one or more valleys may comprise one or more air gaps. In some examples, the one or more peaks and one or more valleys may comprise one or more tapered or jagged edges.

In some examples, the one or more peaks and one or more valleys of the chip pocket may be generated or designed via a saw tooth milling pattern. The saw tooth milling pattern may be programmed or machined by a machine. In contrast to a smooth milling pattern, the saw tooth milling pattern for the chip pocket and one or more connections, or a derivation of the saw tooth milling pattern, makes it difficult to attempt removal and/or remove the chip from the card. Thus, the saw tooth milling pattern promotes the success of adhesion of the chip to the chip pocket while also creating an uneven cutting process to prevent removal of the chip. As a consequence of this removal prevention design, chip fraud is eliminated.

In some examples, each of the one or more peaks and one or more valleys of the chip pocket may comprise same or different shapes, lengths, and/or dimensions so as to produce one or more arrangements of the one or more shapes. Accordingly, one or more connections may comprise different or irregular shapes, lengths, and/or dimensions. In some examples, one or more subsets of the one or more peaks and the one or more valleys may be generated or repeated after a predetermined interval, or one or more subsets of the one or more peaks and one or more valleys may generated or repeated at random, as determined by one or more machining processes. For example, one or more peaks and one or more valleys may be included, and other types of peaks and valleys may comprise one or more angled and/or curved portions. Different variations may be used within a given card issuance, such that the same card issued by an institution may have a number of different patterns based on the particular card that is prepared for the user. In the event the user misplaces their card, a new card may be issued with an entirely different pattern to replace the previous card.

In some examples, the chip may comprise an integrated circuit. In one example, card may include a planar surface comprising a substrate, and a chip embedded or integrated or otherwise in communication with card via one or more electronic components or connections. For example, the one or more connections may comprise one or more leads, wires or pins, or any combination thereof, communicatively coupled to chip. One or more connections may be configured to connect a surface of the chip. The surface may comprise an exterior region of chip, and the chip may project outwards from card to depict its connectivity.

In another example, the card may include a chip embedded or integrated or otherwise in communication with card via one or more electronic components or connections. For example, one or more connections may comprise one or more wires or pins, or any combination thereof, communicatively coupled to chip. One or more connections may be configured to connect a surface of the chip. The surface may comprise an interior region of chip, and the chip may be project outwards from the card to depict its connectivity.

At block 450, after the one or more chip pockets are created for housing the chip, the one or more machines may be configured to punch the chip into the one or more chip pockets. In some examples, other machines may be used in lieu of the stamping machine to punch the chip into the one or more chip pockets.

At block 460, the chip may include MasterCard or Visa information. At this point, no other information exists within the chip, such as card information or to whom the card is assigned to. The card may be associated with one or more card identifiers. In some examples, the one or more card identifiers may be printed adjacent to a corner of the card; however, other regions of the card may be used for display of the one or more card identifiers.

At block 470, the card may be sent to a vault or facility, such as a personalization facility, and the card is ready for pick up. One or more machines within the vault or facility may request the card based on the one or more card identifiers. The one or more machines may receive the card based on the one or more card identifiers and may perform encoding of the magnetic stripe; printing of data, such as account number information and user information, including first and last name, on the front and/or back of the card; encoding of the chip. For example, the card may comprise identification information displayed on the front and/or back of the card, and a contact pad. In some examples, the identification information may comprise one or more of cardholder name and expiration date of the card. The card may also include a magnetic stripe or tape, which may be located on the back of the card.

Figure 5:
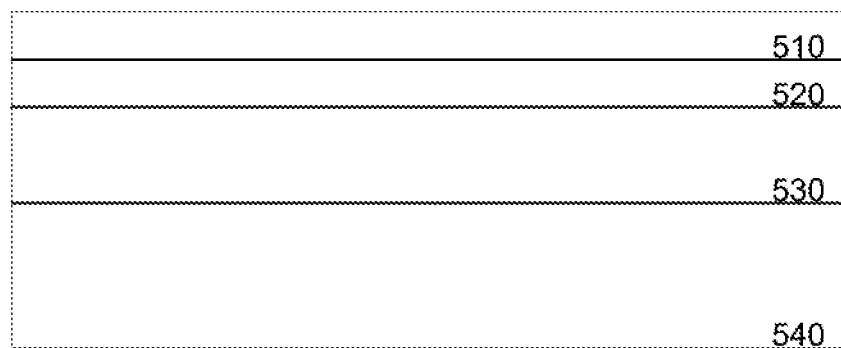
FIG. 5 illustrates a schematic of one or more layers of the contactless card according to an example embodiment.

FIG. 5 illustrates a schematic of one or more layers of the card 500. FIG. 5 may reference the same or similar components of FIGS. 1-4 as explained above.

Card 500 may comprise one or more layers that are laminated together. Although single instances of each layer are depicted in FIG. 5, card 500 may include one or more layers for each layer. In some examples, the card 500 may comprise a first layer 510, such as an outermost or exterior layer which includes a layer that receives paint, ink, or laser treatment. The outermost or exterior layer may comprise the ceiling or top layer of the one or more laminated layers. The outermost or exterior layer may comprise a thin film that receives laser personalization. In some examples, the laser personalization may comprise custom laser personalization.

Card 500 may further comprise a second layer, including one or more artwork layers 520 positioned below the outermost or exterior layer 510. For example, the one or more artwork layers 520 may comprise personalized information about the user and/or financial institution that issues the card 500.

Card 500 may further comprise a third layer 530, including one or more metal core layers positioned below the one or more artwork layers 520.

Card 500 may further comprise a fourth layer 540, including one or more magnetic stripe layer positioned below the one or more metal core layers 530. In some examples, the one or more magnetic stripe layers 540 may comprise the innermost or interior layer of the card 500.

As used herein, the terms "card," "contactless card," and "smartcard" are not limited to a particular type of card. Rather, it is understood that these terms can refer to a contact-based card, a contactless card, or any other card including a chip. It is further understood that the card may be any type of card containing a chip, including without limitation an identity card, a membership card, a loyalty card, an access card, a security card, and a badge.

Exemplary embodiments described herein relate to chips used in smartcards, however, the present disclosure is not limited thereto. It is understood that the present disclosure encompasses chips that may be used in a variety of devices that include electronic components having chips, including without limitation computing devices (e.g., laptop computers, desktop computers, and servers), vehicles (e.g., automobiles, airplanes, trains, and ships), appliances (e.g., televisions, refrigerators, air conditions, furnaces, microwaves, dish washers, smoke detectors, thermostats, and lights), mobile devices (e.g., smartphones and tablets), and wearable devices (e.g., smartwatches).

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one embodiment," or "in one implementation" does not necessarily refer to the same example, embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A chip fraud prevention system, comprising:
    a housing comprising a chip pocket, the chip pocket configured to at least partially encompass an integrated circuit, the chip pocket comprising a peak and a valley; and
    a connection configured to communicatively couple to the integrated circuit, the connection placed between the peak and the valley,
    wherein the peak and the valley create an uneven surface within the housing chip pocket.

2. The chip fraud prevention system of claim 1, wherein the integrated circuit is wholly encompassed in the chip pocket.

3. The chip fraud prevention system of claim 1, wherein:
    the chip pocket comprises a plurality of peaks and a plurality of valleys, and
    the plurality of peaks and the plurality of valleys are formed in a saw tooth milling pattern.

4. The chip fraud prevention system of claim 3, wherein the saw tooth milling pattern is associated with an entity.

5. The chip fraud prevention system of claim 1, wherein:
    the chip pocket comprises a plurality of peaks and a plurality of valleys, and
    the plurality of peaks and the plurality of valleys are formed in a plurality of different shapes.

6. The chip fraud prevention system of claim 1, wherein:
    the chip pocket comprises a plurality of peaks and a plurality of valleys, and
    the plurality of peaks and the plurality of valleys are formed in different shapes, lengths, or dimensions.

7. The chip fraud prevention system of claim 1, wherein the fraud prevention system is a smartcard.

8. The chip fraud prevention system of claim 1, wherein the fraud prevention system is a wearable device.

9. The chip fraud prevention system of claim 1, wherein the fraud prevention system is a vehicle.

10. The chip fraud prevention system of claim 1, wherein the fraud prevention system is an appliance.

11. The chip fraud prevention system of claim 1, wherein the fraud prevention system is a smartphone.

12. The chip fraud prevention system of claim 1, wherein the peak and the valley create an uneven cutting process for removal of the integrated circuit.

13. A fraud prevention method, comprising:
positioning an integrated circuit at least partially within a chip pocket contained in a housing, the chip pocket comprising a peak and a valley creating an uneven surface within the chip pocket;
communicatively coupling a connection to the integrated circuit;
positioning the connection between the peak and the valley; and
communicatively coupling the connection to the chip pocket.

14. The fraud prevention method of claim 13, wherein the connection comprises at least one of a wire or a pin.

15. The fraud prevention method of claim 13, wherein:
the chip pocket comprises a plurality of peaks and a plurality of valleys, and
the plurality of peaks and the plurality of valleys are formed in a saw tooth milling pattern.

16. The fraud prevention method of claim 13, wherein:
the chip pocket comprises a plurality of peaks and a plurality of valleys, and
the plurality of peaks and the plurality of valleys are formed in a plurality of different shapes.

17. The fraud prevention method of claim 13, wherein:
the chip pocket comprises a plurality of peaks and a plurality of valleys, and
the plurality of peaks and the plurality of valleys are formed in different shapes, lengths, or dimensions.

18. The chip fraud prevention method of claim 13, wherein the peak and the valley are repeated after a predetermined interval.

19. The chip fraud prevention method of claim 13, wherein the shape of the peak and the shape of the valley are randomly generated.

20. A card, comprising:
a housing embedded in a substrate, the housing comprising a chip pocket, a peak, and a valley;
an integrated circuit at least partially encompassed within the chip pocket; and
a connection positioned between the peak and the valley, the connection configured to communicatively couple the integrated circuit to the chip pocket,
wherein the peak and the valley form a saw tooth milling pattern within the chip pocket.

* * * * *